(12) United States Patent
Chien et al.

(10) Patent No.: US 7,859,313 B2
(45) Date of Patent: Dec. 28, 2010

(54) EDGE-MISSING DETECTOR STRUCTURE

(75) Inventors: Ting Hsu Chien, Taipei (TW); Chi Sheng Lin, Taipei (TW); Chin-Long Wey, Taipei (TW); Chun-Ming Huang, Taipei (TW); Ying-Zong Juang, Taipei (TW)

(73) Assignee: National Chip Implementation Center National Applied Research Laboratories, Hsinchu (TW)

( * ) Notice: Subject to any disclaimer, the term of this patent is extended or adjusted under 35 U.S.C. 154(b) by 46 days.

(21) Appl. No.: 12/489,624

(22) Filed: Jun. 23, 2009

(65) Prior Publication Data

US 2010/0277203 A1    Nov. 4, 2010

(30) Foreign Application Priority Data

Apr. 30, 2009    (TW) .............................. 98114399 A (51) Int. Cl.
*H03K 5/19*    (2006.01)
*H03K 5/22*    (2006.01)

(52) U.S. Cl. .............................. 327/18; 327/20; 327/24; 327/27

(58) Field of Classification Search ........................ None
See application file for complete search history.

(56) References Cited

U.S. PATENT DOCUMENTS

| | | | | |
|---|---|---|---|---|
| 4,902,920 A | * | 2/1990 | Wolaver | ....................... 327/12 |
| 5,233,232 A | * | 8/1993 | Stuebing et al. | ............. 327/176 |
| 5,530,383 A | * | 6/1996 | May | ............................. 327/39 |
| 6,256,362 B1 | * | 7/2001 | Goldman | ..................... 375/373 |
| 6,891,401 B2 | * | 5/2005 | Starr et al. | ..................... 327/18 |
| 7,003,065 B2 | | 2/2006 | Homol et al. | |
| 7,015,726 B1 | * | 3/2006 | Tayler et al. | ................... 327/24 |
| 7,714,619 B2 | * | 5/2010 | Yamada | ....................... 327/18 |

\* cited by examiner

*Primary Examiner*—Tuan Lam
(74) *Attorney, Agent, or Firm*—Stites & Harbison PLLC; Juan Carlos A. Marquez, Esq.

(57) ABSTRACT

An edge-missing detector structure includes a first detector, a first delay unit, a first logic gate, a second detector, a second delay unit, and a second logic gate. After being input separately into the edge-missing detector structure, a first reference signal and a first clock signal are detected by the first and second detectors and then subjected to cycle suppression by the first and second logic gates, respectively, so as to generate a second reference signal and a second clock signal which present a phase difference less than $2\pi$. Moreover, the edge-missing detector structure generates a compensative current corresponding to the number of occurrences of cycle suppression. Thus, a phase-locked loop (PLL) using the edge-missing detector structure can avoid cycle slip problems and achieve fast acquisition of phase lock.

3 Claims, 8 Drawing Sheets

EDGE-MISSING DETECTOR STRUCTURE

BACKGROUND OF THE INVENTION

1. Technical Field

The present invention relates to edge-missing detector structures and, more particularly, to an edge-missing detector structure for use in a phase-locked loop (PLL).

2. Description of Related Art

A phase-locked loop is a circuit structure used extensively in a variety of communication-related devices such as clock/frequency generators, wireless receivers, and telecommunication equipment. With the advancement of technology, phase-locked loops have found applications in systems beyond the field of communication devices. For example, phase-locked loops are now also used in data recovery circuits, frequency synthesizers, and so on.

Figure 1:
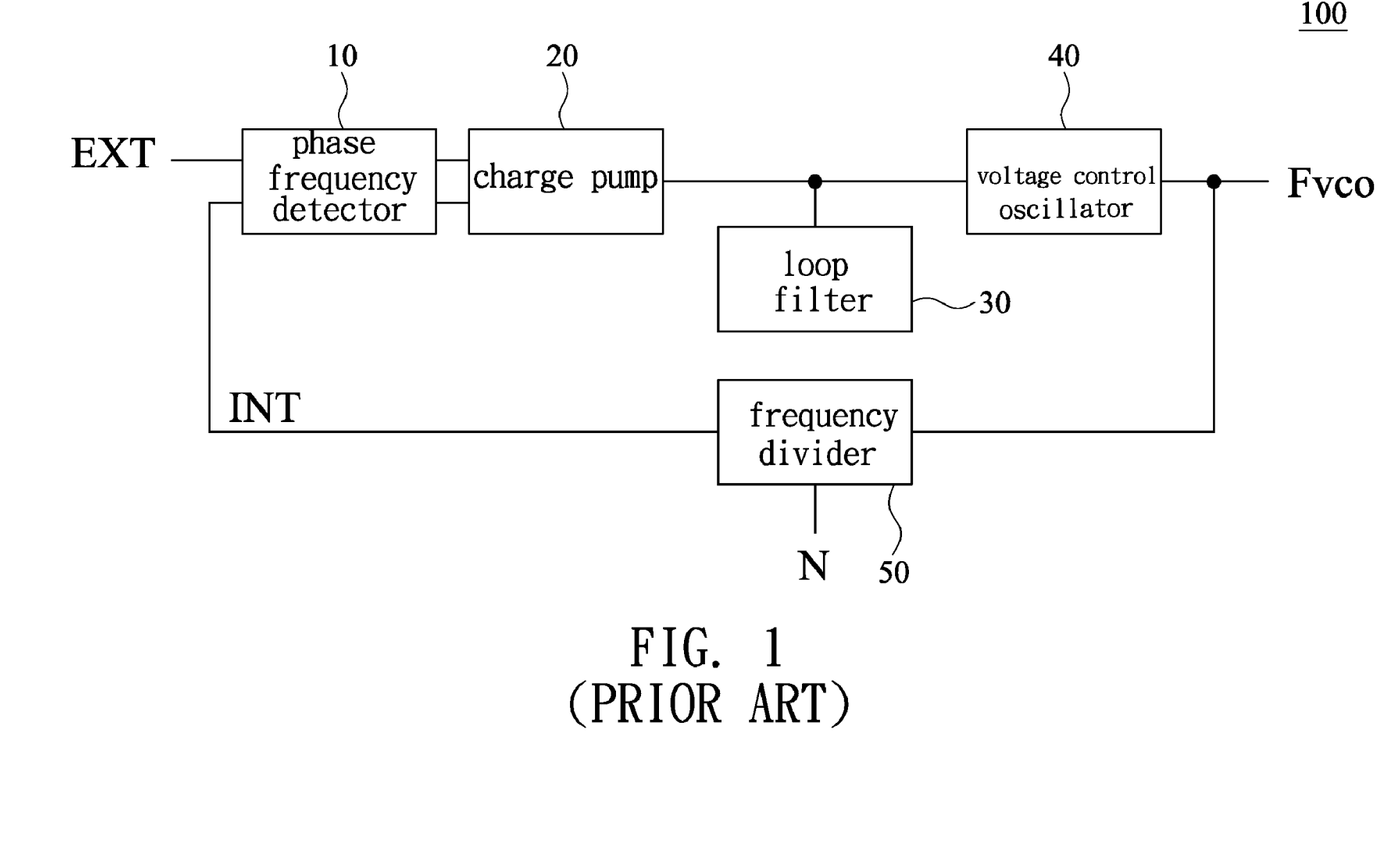
FIG. 1 is a circuit diagram of a conventional phase-locked loop.
Figure 2:
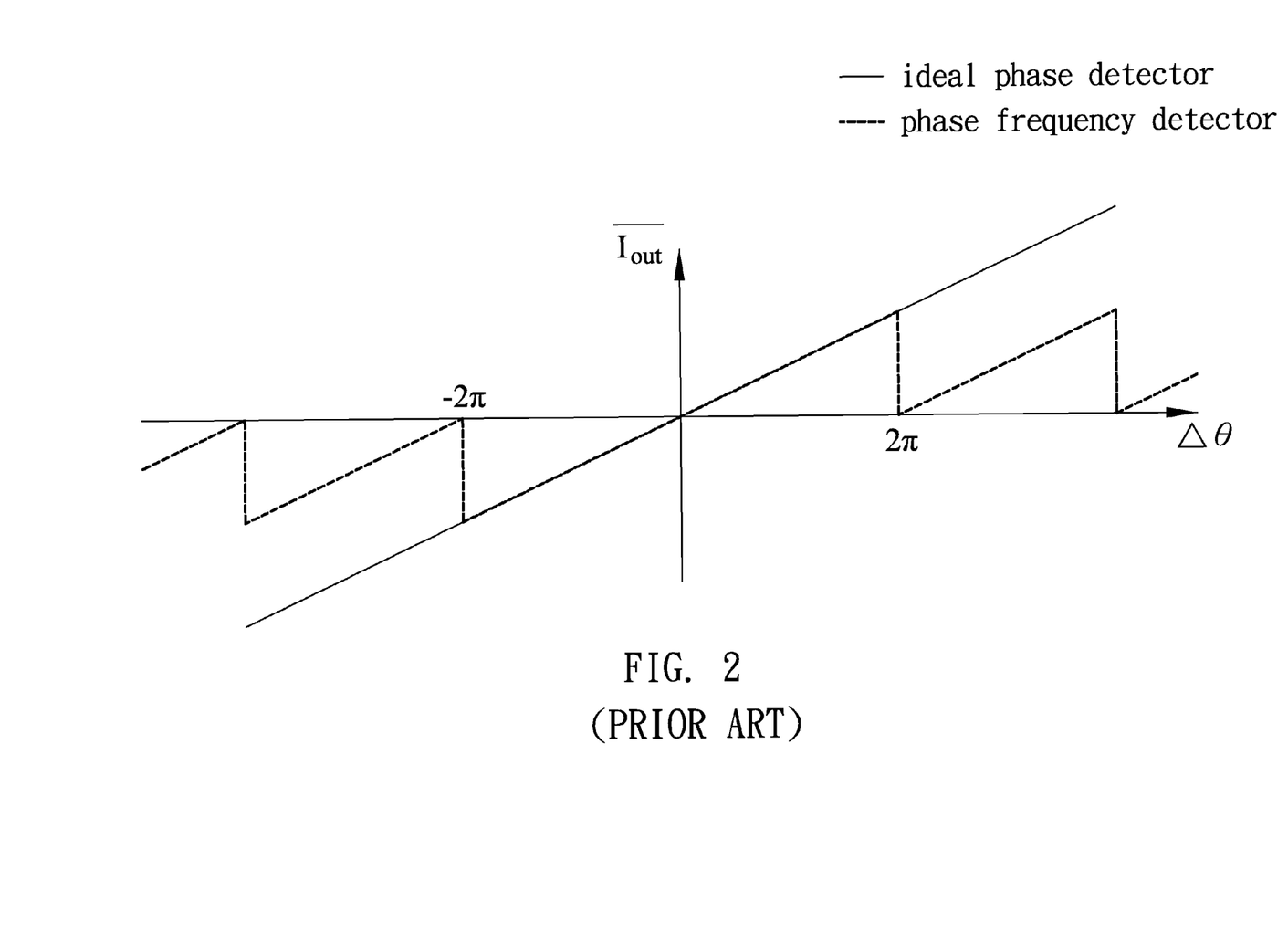
FIG. 2 is a graph showing characteristic curves of a conventional phase frequency detector and an ideal phase detector.
Figure 3:
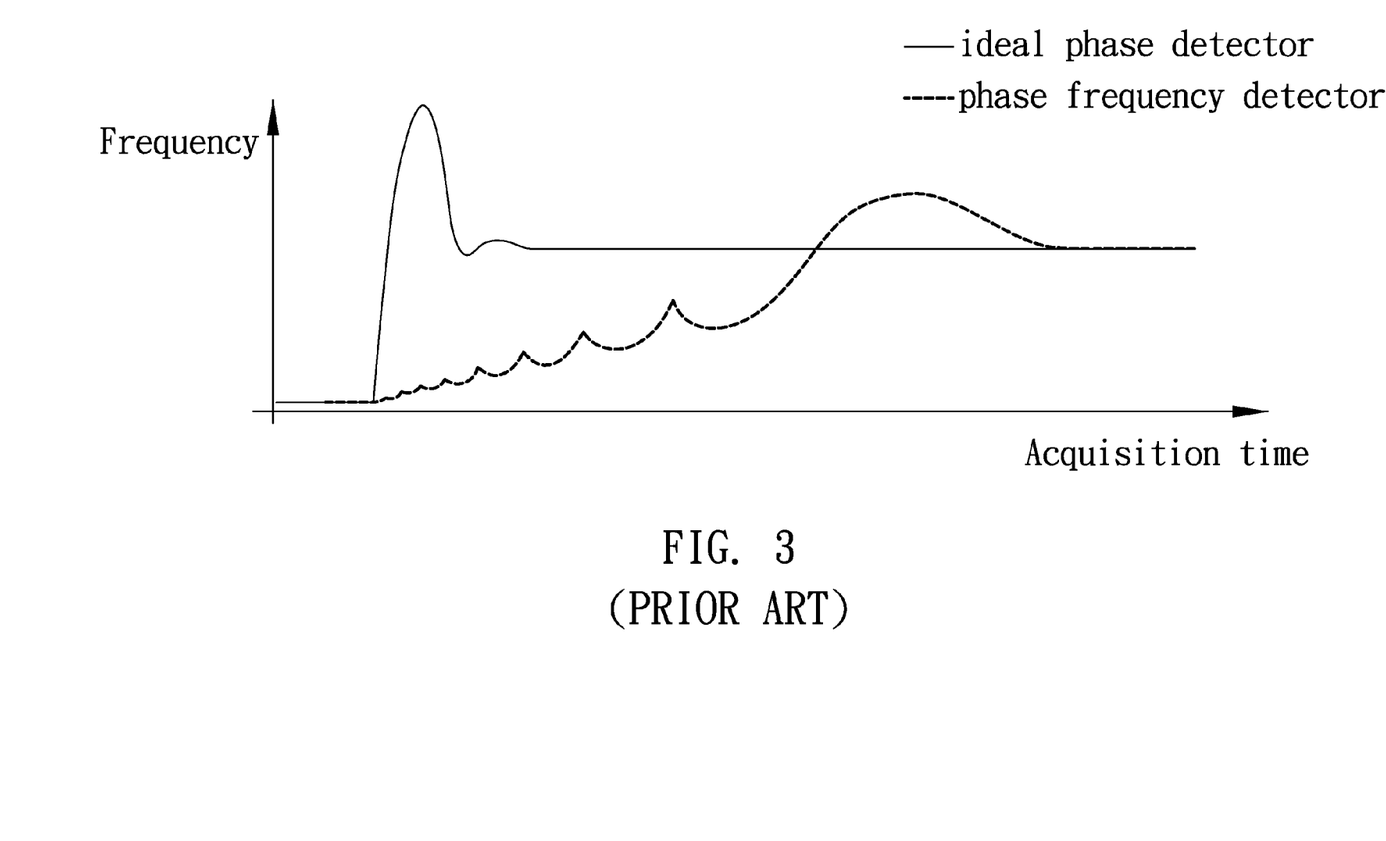
FIG. 3 is a graph showing the comparison of acquisition time between ideal phase detector and conventional phase frequency detector in phase-locked loop.

FIG. 1 is a circuit diagram of a conventional phase-locked loop 100. FIG. 2 is a graph showing characteristic curves of a conventional phase frequency detector 10 and an ideal phase detector. FIG. 3 is a graph showing the comparison of acquisition time between ideal phase detector and conventional phase frequency detector 10 in conventional phase-locked loop 100.

As shown in FIG. 1, the conventional phase-locked loop 100 includes the phase frequency detector 10, a charge pump 20, a loop filter 30, a voltage control oscillator 40, and a frequency divider 50. The phase frequency detector 10 is configured for detecting a phase difference between a first reference frequency EXT generated by a quartz oscillator and a first clock frequency INT obtained by dividing an oscillation frequency Fvco with a divisor signal N. The phase difference detected is then converted by the charge pump 20 into a corresponding current for output.

Referring to FIG. 2, an ideal phase detector has an average output current $\overline{I_{out}}$ which is linearly proportional to the phase difference of input signals. In practice, however, the ideal phase detector has never been realized. Therefore, in place of the ideal phase detector, the phase frequency detector 10 is generally used in the phase-locked loop 100. Nevertheless, the phase frequency detector 10 only maintains linear output within an interval of $2\pi$ and then, on a cycle of $2\pi$, repeatedly outputs an average output current $\overline{I_{out}}$ having a fixed proportion.

Now that the phase frequency detector 10 only maintains linear output when the phase difference is within $2\pi$, if the phase difference between input signals of the phase-locked loop 100 is greater than $2\pi$, the phase frequency detector 10 cannot determine the phase difference accurately, and thus an average output current corresponding to the actual phase difference cannot be generated, thereby causing cycle slip to the phase-locked loop 100; furthermore, as shown in FIG. 3, the phase-locked loop 100 using the phase frequency detector 10 must take a longer acquisition time to lock the accurate phase than when an ideal linear phase detector were used.

As mentioned earlier, the ideal linear phase detector cannot be actually made. Therefore, U.S. Pat. No. 7,003,065 B2 discloses a phase-locked loop cycle slip detection circuit that includes: a phase detector having a first input circuit, a second input circuit, and a reset circuit; and a cycle slip detector for generating a slip indication signal.

According to disclosure of the above-cited US patent, the cycle slip detector controls the output current value of the phase detector when the phase difference of input signals is greater than $2\pi$, thereby reducing errors resulting from cycle slip of the phase-locked loop. However, the subject matter of the aforesaid US patent can only determine whether or not the phase difference of the input signals is greater than $2\pi$, but cannot accurately determine how many times as great the phase difference of the input signals is as $2\pi$. Hence, the function of the ideal linear phase detector is yet to be attained.

1. BRIEF SUMMARY OF THE INVENTION

An objective of the present invention is to provide an edge-missing detector structure wherein a first detector and a first delay unit work in conjunction with a second detector and a second delay unit so as to detect the occurrence of edge-missing when the phase difference between input signals of a phase frequency detector is close to or greater than $2\pi$. Furthermore, a corresponding current corresponding to the number of occurrences of edge-missing is generated for linear compensation.

Another objective of the present invention is to provide an edge-missing detector structure capable of accurately detecting the number of occurrences of edge-missing so that, when used in conjunction with an appropriate compensation device, the edge-missing detector structure enables linear compensation, overcomes the aforementioned cycle slip problems, and shortens the acquisition time of a phase-locked loop.

Still another objective of the present invention is to provide an edge-missing detector structure that can be directly used with an existing phase frequency detector without requiring extra conversion circuitry, so as to have extensive applications.

In order to achieve the above and other objectives, the present invention provides an edge-missing detector structure which includes: a first detector for receiving a first reference signal and a first enable signal so as to generate a second enable signal according to the first reference signal and the first enable signal; a first delay unit for receiving the first reference signal and delaying the first reference signal so as to output a first delayed signal; a first logic gate for suppressing at least one cycle of the first delayed signal according to the second enable signal, so as to generate a second reference signal; a second detector for receiving a first clock signal and a third enable signal so as to generate a fourth enable signal according to the first clock signal and the third enable signal; a second delay unit for receiving the first clock signal and delaying the first clock signal so as to output a second delayed signal; and a second logic gate for suppressing at least one cycle of the second delayed signal so as to generate a second clock signal.

Implementation of the present invention at least involves the following inventive steps:

1. The edge-missing detector structure is configured for accurately detecting the number of occurrences of edge-missing in input signals, thus preventing the cycle slip problems.

2. By preventing the cycle slip problems, the acquisition time of a phase-locked loop using the edge-missing detector structure is shortened.

3. The edge-missing detector structure detects signals in a digital manner so as to feature a compact volume and low power consumption.

4. As the edge-missing detector structure facilitates linear compensation in a phase-locked loop, the acquisition time of the phase-locked loop can be estimated using linear models so as to reduce the time and cost required for designing the phase-locked loop.

2. BRIEF DESCRIPTION OF THE SEVERAL VIEWS OF THE DRAWINGS

A detailed description of further features and advantages of the present invention is given below to enable a person skilled in the art to understand and implement the technical contents of the present invention and comprehend the objectives and advantages thereof by reviewing the teachings disclosed herein and the appended claims in conjunction with the accompanying drawings, in which:

3. DETAILED DESCRIPTION OF THE INVENTION

Figure 4:
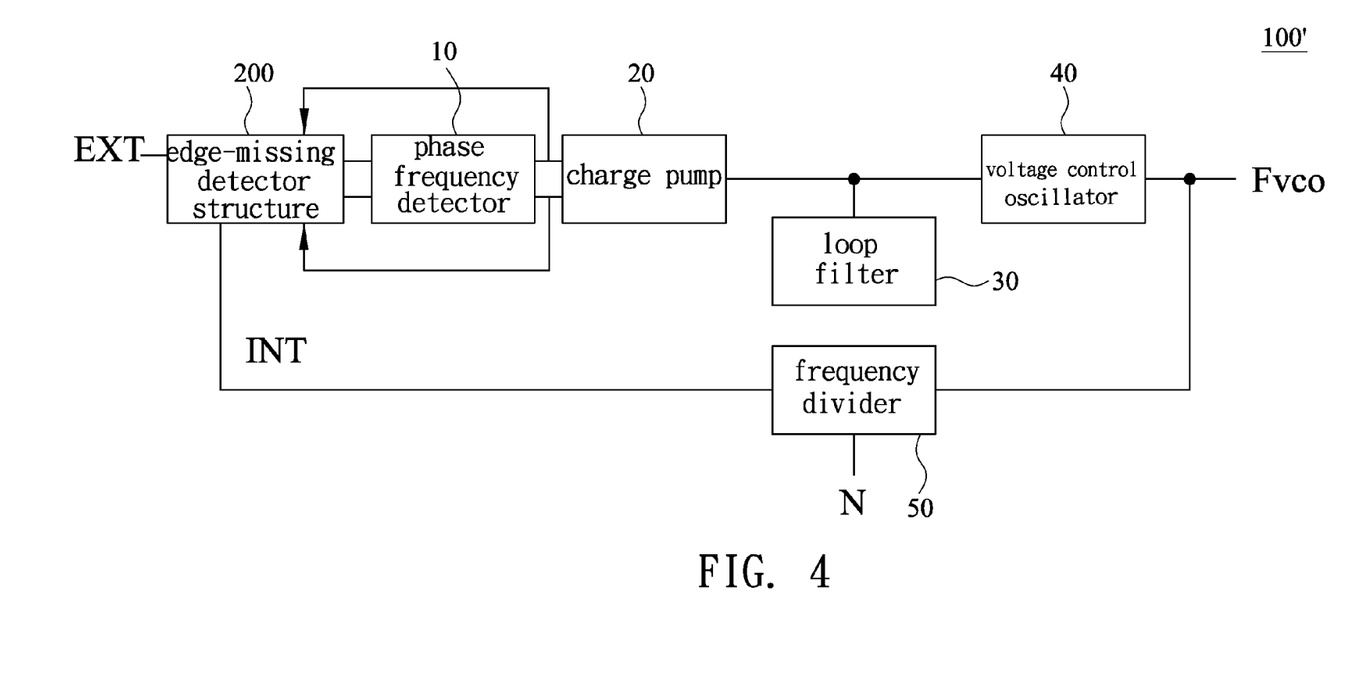
FIG. 4 is a circuit diagram of a phase-locked loop in which an edge-missing detector structure according to the present invention is used.
Figure 5:
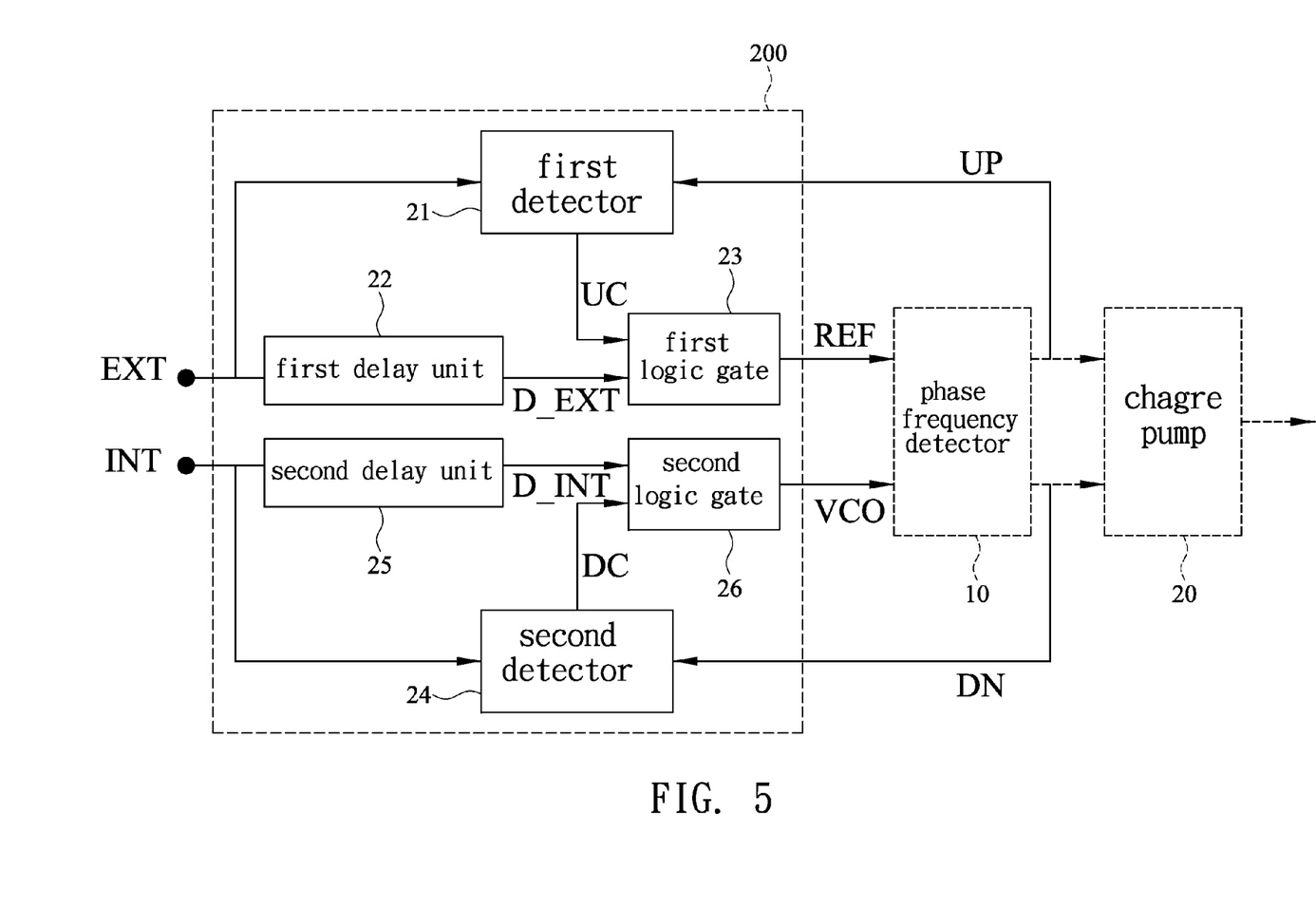
FIG. 5 is a circuit diagram of an edge-missing detector structure according to a first embodiment of the present invention.

Referring to FIG. 4 and FIG. 5, an edge-missing detector structure 200 according to an embodiment of the present invention includes a first detector 21, a first delay unit 22, a first logic gate 23, a second detector 24, a second delay unit 25, and a second logic gate 26. As shown in FIG. 4, the edge-missing detector structure 200 is used in a phase-locked loop (PLL) 100' and coupled with a signal input end of a phase frequency detector 10. Therefore, as shown in FIG. 5, a first reference signal EXT and a first clock signal INT are processed by the edge-missing detector structure 200 before being input to the phase frequency detector 10.

When the signals input to the phase frequency detector 10 present a phase difference $\Delta\theta$ close to or greater than $2\pi$, the phase frequency detector 10 generates from an output end thereof a first enable signal UP or a third enable signal DN, depending on whether the phase difference $\Delta\theta$ is a positive phase difference or a negative phase difference, respectively.

Referring to FIG. 5, the first detector 21, which can be a D flip-flop, a T flip-flop, or a JK flip-flop, receives the first enable signal UP output from the output end of the phase frequency detector 10 and the first reference signal EXT. The first reference signal EXT is a standard clock signal generated by a quartz oscillator and serves as a reference clock for the first detector 21. The first detector 21 detects the occurrence of edge-missing according to the first reference signal EXT and the first enable signal UP and then generates a second enable signal UC according to the detection result.

The first delay unit 22 receives the first reference signal EXT and delays the first reference signal EXT so as to output a first delayed signal D_EXT. As the first detector 21 needs some detection time for detecting the occurrence of edge-missing and for generating the second enable signal UC, the first delay unit 22 is configured to delay the first reference signal EXT by an interval at least greater than one time the detection time so that the second enable signal UC is input to the first logic gate 23 earlier than the first delayed signal D_EXT, thus allowing the second enable signal UC to timely control the first logic gate 23 as to whether or not to process the first delayed signal D_EXT.

If the second enable signal UC output from the first detector 21 instructs the first logic gate 23 to begin processing, the first logic gate 23 will perform cycle suppression on the first delayed signal D_EXT so that at least one cycle of the first delayed signal D_EXT is suppressed, thereby generating a second reference signal REF. The second reference signal REF, which has gone through cycle suppression, becomes an input signal to the phase frequency detector 10. The first logic gate 23 can be an AND gate, an OR gate, an exclusive-OR gate, a NOR gate, or a NAND gate.

As shown in FIG. 5, the second detector 24 receives the third enable signal DN output from the output end of the phase frequency detector 10 and the first clock signal INT. Like the first detector 21, the second detector 24 can also be a D flip-flop, a T flip-flop, or a JK flip-flop.

The first clock signal INT is generated by a voltage control oscillator 40 in the phase-locked loop 100' (see FIG. 4). Therefore, there may be a phase difference $\Delta\theta$ between the first clock signal INT and the first reference signal EXT, and the phase difference $\Delta\theta$ may be smaller or greater than $2\pi$. The second detector 24 detects the occurrence of edge-missing according to the first clock signal INT and the third enable signal DN and then generates a fourth enable signal DC according to the detection result.

The second delay unit 25 receives and delays the first clock signal INT so as to output a second delayed signal D_INT. Now that the second detector 24 also needs some detection time for detecting the occurrence of edge-missing and for generating the fourth enable signal DC, the second delay unit 25 is configured to delay the first clock signal INT by an interval greater than one time the detection time of the second detector 24, thus generating the second delayed signal D_INT. Consequently, the fourth enable signal DC is input to the second logic gate 26 earlier than the second delay signal D_INT so as to timely control the second logic gate 26 as to whether or not to process the second delayed signal D_INT.

If the fourth enable signal DC from the second detector 24 instructs the second logic gate 26 to begin processing, the second logic gate 26 will perform cycle suppression on the second delayed signal D_INT, so that at least one cycle of the second delayed signal D_INT is suppressed, thereby generating a second clock signal VCO, which is subsequently input to the phase frequency detector 10. The second logic gate 26 can be an AND gate, an OR gate, an exclusive-OR gate, a NOR gate, or a NAND gate.

The second reference signal REF and the second clock signal VCO, which are processed and then generated by the first logic gate 23 and the second logic gate 26, respectively, have a phase difference $\Delta\theta$ controllable via the aforesaid cycle-suppressing process, which can effectively render the phase difference Δθ smaller than 2π. For example, the phase difference Δθ may be limited at ½ of 2π, ¾ of 2π, and so forth.

As shown in FIG. 5, the second reference signal REF and the second clock signal VCO output from the edge-missing detector structure 200 are input to the phase frequency detector 10. Now that the phase difference Δθ between the second reference signal REF and the second clock signal VCO is less than 2π, the phase frequency detector 10 can control a charge pump 20 in the phase-locked loop 100' according to the phase difference Δθ so that the charge pump 20 accurately outputs a corresponding current $I_{CP}$ (see FIG. 7). More specifically, the greater the phase difference Δθ is, the higher the output current will be.

Figure 6:
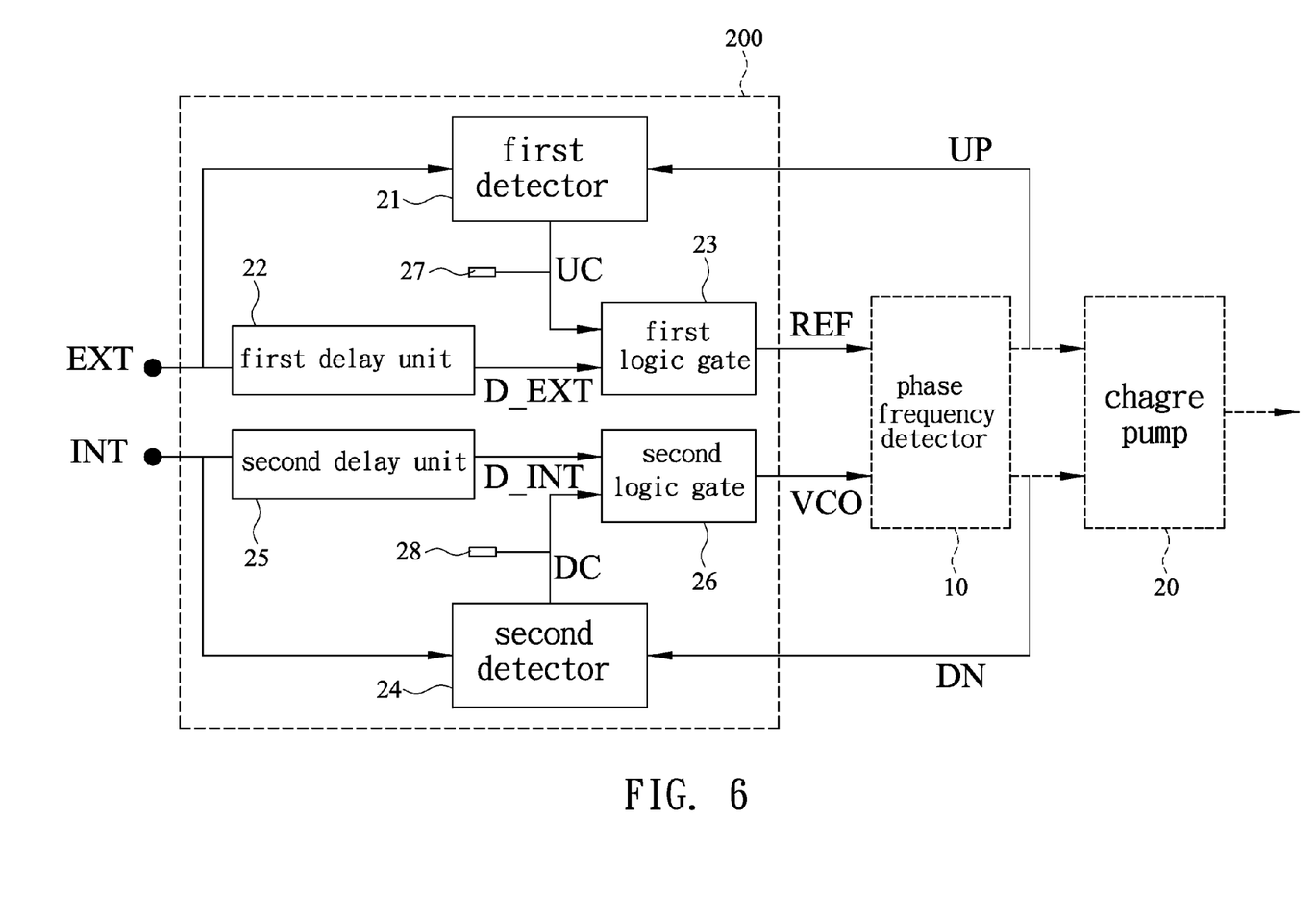
FIG. 6 is a circuit diagram of an edge-missing detector structure according to a second embodiment of the present invention.

Referring to FIG. 6, the edge-missing detector structure 200 further has a first counting signal output end 27 and a second counting signal output end 28 which are electrically connected to the second enable signal UC and the fourth enable signal DC, respectively. Therefore, the first counting signal output end 27 and the second counting signal output end 28 can be used to output the second enable signal UC and the fourth enable signal DC, respectively.

In addition, the first counting signal output end 27 and the second counting signal output end 28 may be further connected to a counter (not shown) which, according to the second enable signal UC and the fourth enable signal DC in conjunction with the first reference signal EXT and the first clock signal INT, counts the number of cycles (such as one 2π-cycle, two 2π-cycles, four 2π-cycles, and so on) of the first delayed signal D_EXT and of the second delayed signal D_INT that are suppressed by the first logic gate 23 and the second logic gate 26, respectively. The counter then sends a resultant counting signal to the charge pump 20 (not shown).

Figure 7:
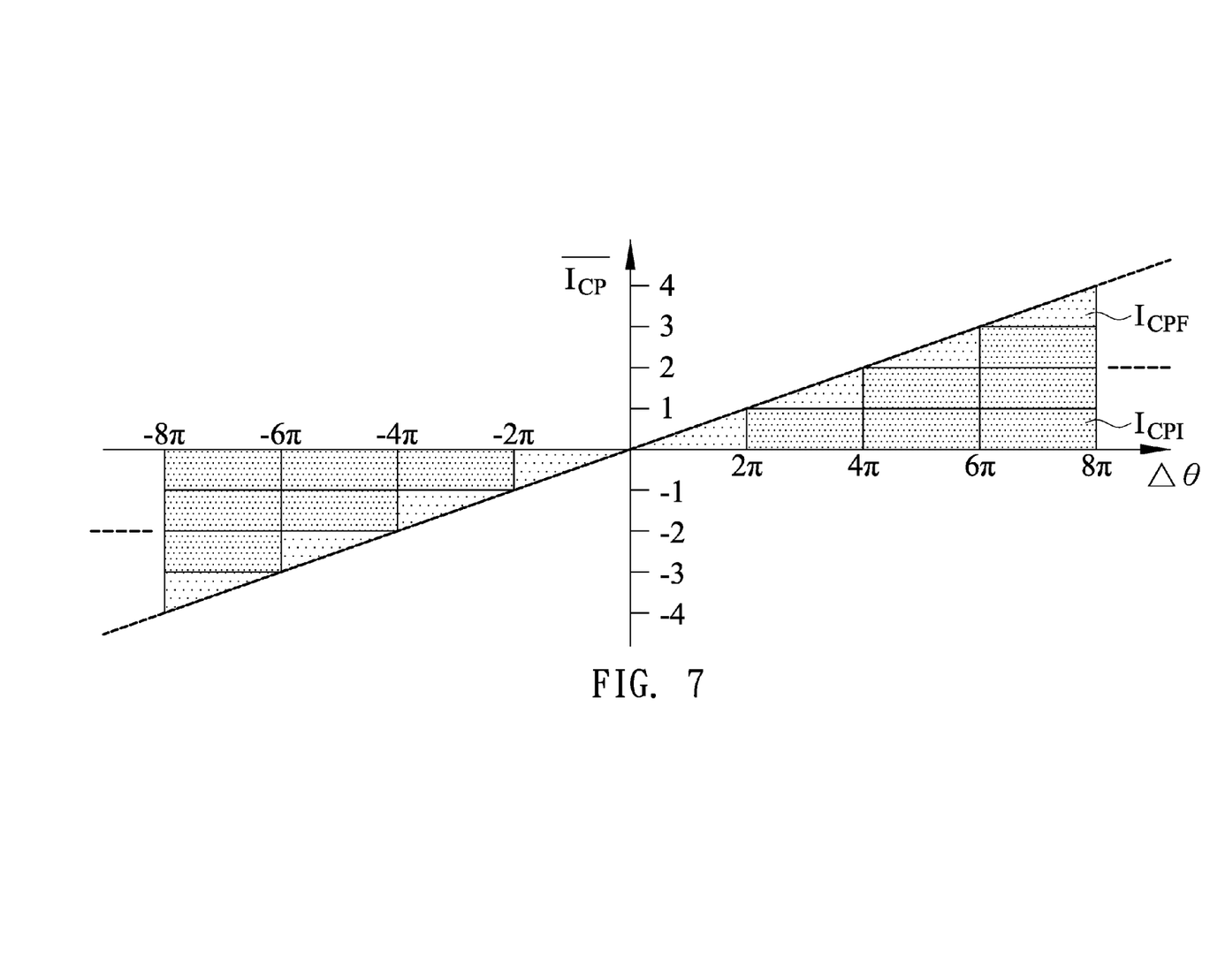
FIG. 7 is a graph showing the relationship between phase difference and a corresponding e current output by a charge pump when the edge-missing detector structure according to the present invention is coupled with a phase frequency detector and the charge pump.

Thus, referring to FIG. 7, the charge pump 20 outputs a corresponding current $I_{CP}$ which is based on a first current $I_{CPF}$ and a second current $I_{CPI}$ so as to match the actual phase difference Δθ, wherein the first current $I_{CPF}$ is generated corresponding to the compensative signal from the phase frequency detector 10, and the second current $I_{CPI}$ is generated corresponding to the counting signal from the counter. As a result, linear compensation is achieved while the acquisition time of the phase-locked loop 100' is shortened significantly.

Figure 8:
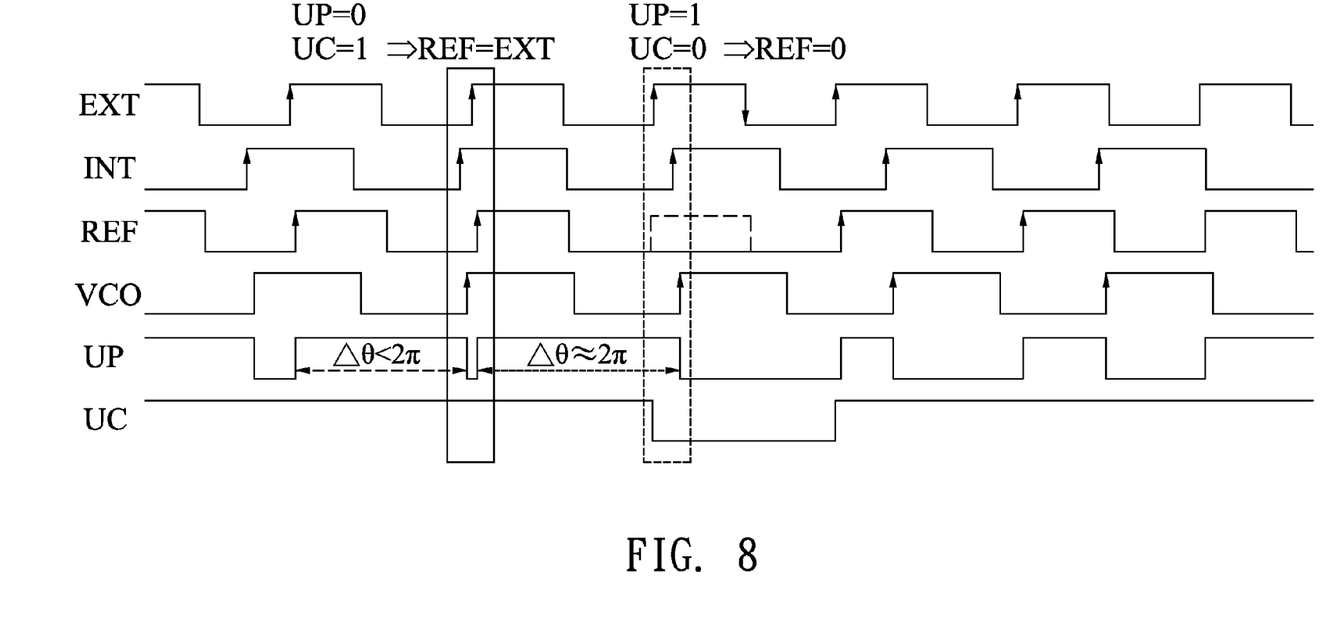
FIG. 8 is a timing diagram of a first reference signal, a second reference signal, a first clock signal, a second clock signal, a first enable signal, and a second enable signal according to the present invention.

FIG. 8 is a timing diagram illustrating operation of the edge-missing detector structure 200 coupled with the phase frequency detector 10. As shown in FIG. 8, when a positive phase difference Δθ ($\Delta\theta=\Delta\theta_{EXT}-\Delta\theta_{INT}$) smaller than 2π exists between the first reference signal EXT and the first clock signal INT to be input to the edge-missing detector 200, the first enable signal UP corresponding to a rising edge of the first reference signal EXT is 0 (as shown in the solid-line frame of FIG. 8). The first detector 21, which is a D flip-flop for example, receives the first reference signal EXT and the first enable signal UP and then outputs the second enable signal UC that equals 1. After receiving the second enable signal UC, the first logic gate 23, which can be an AND gate, refrains from performing cycle suppression so that the second reference signal REF input to the phase frequency detector 10 is equal to the first reference signal EXT. In other words, the edge-missing detector structure 200 did not perform any cycle-suppressing action.

However, after a few cycles, the positive phase difference Δθ between the first reference signal EXT and the first clock signal INT approaches 2π, and in consequence the first enable signal UP corresponding to a rising edge of the first reference signal EXT is 1 (as shown in the dashed-line frame of FIG. 8). Upon receiving the first enable signal UP, the first detector 21 starts detection and calculation so as to generate the second enable signal UC that is equal to 0. The first logic gate 23 receives the second enable signal UC and then performs cycle suppression so that the second reference signal REF output from the edge-missing detector structure 200 has less one cycle (2π) then the first reference signal EXT, as illustrated in FIG. 8 by the dashed-line pulse of the second reference signal REF where REF=0. The phase difference Δθ between the second reference signal REF and the second clock signal VCO is thus controlled within a range smaller than 2π.

As mentioned earlier, the edge-missing detector structure 200 can be coupled to a counter via the first counting signal output end 27, wherein the counter is configured to accurately count the number of integer cycles suppressed by the first logic gate 23 and then output a counting signal accordingly, thereby controlling the output of the corresponding current $I_{CP}$ from the charge pump 20. When a negative phase difference Δθ exists between the second reference signal REF and the second clock signal VCO, the actions performed by the edge-missing detector structure 200 are similar to those described above and are not repeated herein.

The edge-missing detector structure 200 features low costs and low power consumption because it detects signals in a digital manner and is actuated only when the phase difference Δθ is greater than 2π. More advantageously, the edge-missing detector structure 200 can be directly coupled to an existing phase frequency detector 10 without using extra conversion circuitry, so as to find extensive applications with the phase-locked loops 100 and 100'. Moreover, the edge-missing detector structure 200 can work with any compensation devices.

In addition, the edge-missing detector structure 200 can be further connected with an N-bit counter for recording the integer cycles suppressed, thereby expanding the linear comparison zone of the edge-missing detector structure 200 to $\pm 2^{N-1} \times 2\pi$. Hence, not only is the detection range broadened, but also the acquisition time of the phase-locked loop 100' is estimable using theoretical linear models, thus reducing the time and cost required for designing the phase-locked loop 100'.

The embodiments described above are intended to demonstrate the features of the present invention so that a person of skill in the art is enabled to understand and implement the contents disclosed herein. These embodiments, however, are not to limit the scope of the present invention. Therefore, all equivalent changes or modifications which do not depart from the spirit of the present invention should be encompassed by the appended claims.

What is claimed is:

1. An edge-missing detector structure, comprising:
   a first detector for receiving a first reference signal and a first enable signal so as to generate a second enable signal according to the first reference signal and the first enable signal;
   a first delay unit for receiving and delaying the first reference signal so as to output a first delayed signal;
   a logic gate for suppressing at least one cycle of the first delayed signal according to the second enable signal, so as to generate a second reference signal;
   a second detector for receiving a first clock signal and a third enable signal so as to generate a fourth enable signal according to the first clock signal and the third enable signal;
   a second delay unit for receiving and delaying the first clock signal so as to output a second delayed signal; and a second logic gate for suppressing at least one cycle of the second delayed signal according to the fourth enable signal, so as to generate a second clock signal.

2. The edge-missing detector structure of claim 1, further having a first counting signal output end electrically connected to an output end of the second enable signal.

3. The edge-missing detector structure of claim 1, further having a second counting signal output end electrically connected to an output end of the fourth enable signal.

* * * * *